(12) United States Patent
Peng et al.

(10) Patent No.: US 6,856,540 B2
(45) Date of Patent: *Feb. 15, 2005

(54) HIGH DENSITY SEMICONDUCTOR MEMORY CELL AND MEMORY ARRAY USING A SINGLE TRANSISTOR

(75) Inventors: Jack Zezhong Peng, San Jose, CA (US); David Fong, Cupertino, CA (US)

(73) Assignee: Kilopass Technologies, Inc., Sunnyvale, CA (US)

(*) Notice: Subject to any disclaimer, the term of this patent is extended or adjusted under 35 U.S.C. 154(b) by 40 days.

This patent is subject to a terminal disclaimer.

(21) Appl. No.: 10/448,505

(22) Filed: May 30, 2003

(65) Prior Publication Data

US 2003/0206467 A1 Nov. 6, 2003

Related U.S. Application Data

(63) Continuation-in-part of application No. 10/133,704, filed on Apr. 26, 2002, now Pat. No. 6,777,757.

(51) Int. Cl.⁷ ............................................. G11C 11/34
(52) U.S. Cl. .............. 365/177; 365/185.14; 365/185.28
(58) Field of Search ................................ 365/177, 178, 365/185.14, 185.18, 185.28, 185.29

(56) References Cited

U.S. PATENT DOCUMENTS

| | | | |
|---|---|---|---|
| 3,634,929 A | 1/1972 | Yoshida et al. | |
| 4,322,822 A | 3/1982 | McPherson | |
| 4,488,262 A | 12/1984 | Basire et al. | |
| 4,490,900 A | 1/1985 | Chiu | |
| 4,502,208 A | 3/1985 | McPherson | |
| 4,507,757 A | 3/1985 | McElroy | |
| 4,543,594 A | 9/1985 | Mohsen et al. | |
| 4,546,273 A | 10/1985 | Osman | |
| 4,599,705 A | 7/1986 | Holmberg et al. | |
| 4,613,886 A | 9/1986 | Chwang | |
| 4,677,742 A | 7/1987 | Johnson | |

(List continued on next page.)

FOREIGN PATENT DOCUMENTS

| | | |
|---|---|---|
| EP | 0 295 935 A1 | 12/1988 |
| JP | 61292295 | 12/1986 |

OTHER PUBLICATIONS

DeGraaf, C., et al, A Novel High–Density Low–Cost Diode Programmable Read Only Memory, IEEE, 1996.
Miranda, Enrique et al; Analytic Modeling of Leakage Current Through Multiple Breakdown Paths in SiO2 Films; 39$^{th}$ Annual International Reliability Physics Symposium; Orlando, FL 2001.
Lombardo, S. et al; Softening of Breakdown in Ultra–Thin Gate Oxide nMOSFET's at Low Inversion Layer Density; 39$^{th}$ Annual International Reliability Physics Symposium; Orlando, FL 2001.
Wu, E.W. et al; Voltage–Dependent Voltage–Acceleration of Oxide Breakdown for Ultra–Thin Oxides; IEEE, 2000.
Rasras, Mahmoud et al; Substrate Hole Current Origin After Oxide Breakdown; IEEE, 2000.
Sune, Jordi et al; Post Soft Breakdown Conduction in SiO2 Gate Oxides; IEEE, 2000.

Primary Examiner—Gene N. Auduong
(74) Attorney, Agent, or Firm—Perkins Coie LLP (57) ABSTRACT

A programmable memory cell comprised of a transistor located at the crosspoint of a column bitline and a row wordline is disclosed. The transistor has its gate formed from the column bitline and its source connected to the row wordline. The memory cell is programmed by applying a voltage potential between the column bitline and the row wordline to produce a programmed n+region in the substrate underlying the gate of the transistor.

11 Claims, 10 Drawing Sheets

U.S. PATENT DOCUMENTS

| | | | |
|---|---|---|---|
| 4,758,986 | A | 7/1988 | Kuo |
| 4,794,562 | A | 12/1988 | Kato et al. |
| 4,823,181 | A | 4/1989 | Mohsen et al. |
| 4,876,220 | A | 10/1989 | Mohsen et al. |
| 4,899,205 | A | 2/1990 | Hamdy et al. |
| 4,943,538 | A | 7/1990 | Mohsen et al. |
| 4,962,342 | A | 10/1990 | Mead et al. |
| 5,138,410 | A | 8/1992 | Takebuchi |
| 5,150,179 | A | 9/1992 | Gill |
| 5,303,185 | A | 4/1994 | Hazani |
| 5,304,871 | A | 4/1994 | Dharmarajan et al. |
| 5,323,342 | A | 6/1994 | Wada et al. |
| 5,412,244 | A | 5/1995 | Hamdy et al. |
| 5,477,499 | A | 12/1995 | Van Buskirk et al. |
| 5,496,756 | A | 3/1996 | Sharma et al. |
| 5,576,568 | A | 11/1996 | Kowshik |
| 5,578,848 | A | 11/1996 | Kwong et al. |
| 5,586,270 | A | 12/1996 | Rotier et al. |
| 5,587,603 | A | 12/1996 | Kowshik |
| 5,600,265 | A | 2/1997 | El Gamal et al. |
| 5,675,541 | A | 10/1997 | Leterrier |
| 5,675,547 | A | 10/1997 | Koga |
| 5,745,417 | A | 4/1998 | Kobayashi et al. |
| 5,825,200 | A | 10/1998 | Kolze |
| 5,825,201 | A | 10/1998 | Kolze |
| 5,880,512 | A | 3/1999 | Gordon et al. |
| 5,909,049 | A | 6/1999 | McCollum |
| 5,986,931 | A | 11/1999 | Caywood |
| 5,986,939 | A * | 11/1999 | Yamada ................. 365/185.29 |
| 6,016,268 | A | 1/2000 | Worley |
| 6,034,893 | A | 3/2000 | Mehta |
| 6,040,968 | A | 3/2000 | Duvvury et al. |
| 6,064,595 | A | 5/2000 | Logie et al. |
| 6,084,428 | A | 7/2000 | Kolze et al. |
| 6,097,077 | A | 8/2000 | Gordon et al. |
| 6,153,463 | A * | 11/2000 | Wei et al. .................... 438/253 |
| 6,157,568 | A | 12/2000 | Schmidt |
| 6,166,954 | A | 12/2000 | Chern |
| 6,214,666 | B1 | 4/2001 | Mehta |
| 6,215,140 | B1 | 4/2001 | Reisinger et al. |
| 6,218,274 | B1 | 4/2001 | Komatsu |
| 6,232,631 | B1 | 5/2001 | Schmidt et al. |
| 6,249,809 | B1 | 6/2001 | Bro |
| 6,282,123 | B1 | 8/2001 | Mehta |
| 6,294,809 | B1 | 9/2001 | Logie |
| 6,297,103 | B1 | 10/2001 | Ahn et al. |
| 6,304,666 | B1 | 10/2001 | Warren et al. |
| 6,351,428 | B2 | 2/2002 | Forbes |
| 6,421,293 | B1 | 7/2002 | Candelier et al. |
| 6,431,456 | B2 | 8/2002 | Nishizawa et al. |
| 6,456,535 | B2 | 9/2002 | Forbes et al. |
| 6,556,481 | B1 | 4/2003 | Hsu et al. |
| 6,777,757 | B2 * | 8/2004 | Peng et al. .................. 257/368 |
| 2001/0003374 | A1 | 6/2001 | Bohmer et al. |

* cited by examiner

|  | | VBL (V) | VWL (V) | PROGRAM |
|---|---|---|---|---|
| PROGRAM | SC/SR | $V_{pp}$ | 0 | YES — 401 |
|  | SC/UR | $V_{pp}$ | Float or $V_{pp}$ | NO — 403 |
|  | UC/SR | 0 or float | 0 | NO — 405 |
|  | UC/UR | 0 or float | Float or $V_{pp}$ | NO — 407 |
| READ | SC/SR | $V_{cc}$ | 0 | ISENSE — 409 |
|  | SC/UR | $V_{RD}$ | Float or $V_{RD}$ | YES — 411 |
|  | UC/SR | 0 | 0 | NO — 413 |
|  | UC/UR | 0 | Float or $V_{RD}$ | NO — 415 |

FIGURE 11

# HIGH DENSITY SEMICONDUCTOR MEMORY CELL AND MEMORY ARRAY USING A SINGLE TRANSISTOR

CROSS REFERENCE TO RELATED APPLICATIONS

This application is a continuation-in-part of U.S. application Ser. No. 10/133,704, filed Apr. 26, 2002, now U.S. Pat. No. 6,777,757, which is incorporated by reference herein.

TECHNICAL FIELD OF THE INVENTION

The present invention relates to a nonvolatile programmable semiconductor memory, and more particularly to a single transistor memory cell programmed by break down of the transistor gate oxide, and a memory array incorporating such cells.

BACKGROUND OF THE INVENTION

Nonvolatile memory retains stored data when power is removed, which is desirable in many different types of electronic devices. One commonly available type of nonvolatile memory is the programmable read-only memory ("PROM"), which uses word line—bit line crosspoint elements such as fuses, anti-fuses, and trapped charge devices such as the floating gate avalanche injection metal oxide semiconductor ("FAMOS") transistor to store logical information.

An example of one type of PROM cell that uses the breakdown of a silicon dioxide layer in a capacitor to store digital data is disclosed in U.S. Pat. No. 6,215,140 to Reisinger et al. The basic PROM disclosed by Reisinger et al. uses a series combination of an oxide capacitor and a junction diode as the crosspoint element (the term "crosspoint" refers to the intersection of a bitline and a wordline). An intact capacitor represents the logic value 0, and an electrically broken-down capacitor represents the logic value 1. The thickness of the silicon dioxide layer is adjusted to obtain the desired operation specifications. Silicon dioxide has a breakdown charge of about 10 C/cm² (Coulomb/cm²). If a voltage of 10 volts is applied to a capacitor dielectric with a thickness of 10 nm (resultant field strength 10 mV/cm), a current of about 1 mA/cm² flows. With 10 volts, this thus results in a substantial amount of time for programming a memory cell. However, it is more advantageous to design the capacitor dielectric to be thinner, in order to reduce the high power loss which occurs during electrical breakdown. For example, a memory cell configuration having a capacitor dielectric with a thickness of 3 to 4 nm can be operated at about 1.5 V. The capacitor dielectric does not yet break down at this voltage, so that 1.5 V is sufficient to read data from the memory cell. Data are stored, for example, at 5 V, in which case one cell strand in a memory cell configuration can be programmed within about 1 millisecond. The energy loss which occurs in this case per cm² of capacitor dielectric is then about 50 Watts (10 Coulomb*5 V). If the desired power loss is about 0.5 W, about 100 seconds are required to program a 1 Gigabit memory. If the permissible power losses are higher, the programming can be carried out correspondingly more quickly.

Some types of nonvolatile memory are capable of being repeatedly programmed and erased, including erasable programmable read only semiconductor memory generally known as EPROM, and electrically erasable programmable read only semiconductor memory generally known as EEPROM. EPROM memory is erased by application of ultraviolet light and programmed by application of various voltages, while EEPROM memory is both erased and programmed by application of various voltages. EPROMs and EEPROMs have suitable structures, generally known as floating gates, that are charged or discharged in accordance with data to be stored thereon. The charge on the floating gate establishes the threshold voltage, or $V_T$, of the device, which is sensed when the memory is read to determine the data stored therein. Typically, efforts are made to minimize gate oxide stress in these types of memory cells.

A device known as a metal nitride oxide silicon ("MNOS") device has a channel located in silicon between a source and drain and overlain by a gate structure that includes a silicon dioxide layer, a silicon nitride layer, and an aluminum layer. The MNOS device is switchable between two threshold voltage states $V_{TH(high)}$ and $V_{TH(low)}$ by applying suitable voltage pulses to the gate, which causes electrons to be trapped in the oxide-nitride gate ($V_{TH(high)}$) or driven out of the oxide-nitride gate ($V_{TH(low)}$). Again, efforts are made to minimize gate oxide stress in these types of memory cells.

A junction breakdown memory cell that uses a stored charge on the gate of a gate controlled diode to store logic 0 and 1 values is disclosed in U.S. Pat. No. 4,037,243 to Hoffman et al. Charge is stored on the gate by using a capacitance formed between the p-type electrode of the gate controlled diode and the gate electrode. Charge storage is enhanced by using a composite dielectric in the capacitor formed from silicon dioxide and silicon nitride layers in place of silicon dioxide. The application of an erase voltage to the electrode of the gate controlled diode causes the oxide-nitride interface surface to fill with negative charge, which is retained after the erase operation is completed. This negative interface charge causes the gate controlled diode to operate in an induced junction mode even after the erase voltage is removed. When the gate controlled diode is thereafter read, it exhibits field-induced junction breakdown of its channel and a saturation current flows. The field induced junction breakdown voltage is less than the metallurgical junction breakdown voltage. However, the application of a write voltage to the electrode of the gate controlled diode causes the silicon dioxide/silicon nitride interface to fill with positive charge, which is retained after the write operation is completed. When the gate controlled diode is thereafter read, it will not break down because no channel exists. Only a slight current flows. The different current flows are sensed and indicate different logic states.

Improvements in the various processes used for fabricating the various types of nonvolatile memory tend to lag improvements in widely used processes such as the advanced CMOS logic process. For example, processes for devices such as flash EEPROM devices tend to use 30% more mask steps than the standard advanced CMOS logic process to produce the various special regions and structures required for the high voltage generation circuits, the triple well, the floating gate, the ONO layers, and the special source and drain junctions typically found in such devices. Accordingly, processes for flash devices tend to be one or two generations behind the standard advanced CMOS logic process and about 30% more expensive on a cost-per-wafer basis. As another example, processes for antifuses must be suitable for fabricating various antifuse structures and high voltage circuits, and so also tend to be about one generation behind the standard advanced CMOS process.

Generally, great care is taken in the fabrication of the silicon dioxide layer used in metal-oxide-silicon (MOS)

devices such as capacitors and transistors. The high degree of care is necessary to ensure that the silicon dioxide layer is not stressed during manufacture or subsequent normal operation of the integrated circuit, so that the desired device characteristics are attained and are stable over time. One example of how much care is taken during fabrication is disclosed in U.S. Pat. No. 5,241,200 to Kuroda, which discloses the use of a diffused layer and a shunt to discharge charges accumulated in the word line during a wafer fabrication process. Avoiding this charge accumulation ensures that a large electric field is not applied to the gate insulating film, so that variations in the characteristics of transistors using the word line as their gate wiring line and degradation and breakdown of the gate insulating film are prevented.

An example of how much care is taken in circuit design to avoid stressing the silicon dioxide layer of a transistor during normal circuit operation is disclosed in U.S. Pat. No. 6,249,472 to Tamura et al. Tamura et al. disclose an antifuse circuit having an antifuse in series with a p-channel MOS transistor in one embodiment and in series with an n-channel MOS transistor in another embodiment. While the antifuse is fabricated without the additional film manufacturing processes typically required for fabricating antifuse circuits, Tamura et al. poses another problem. When the antifuse is shorted out, the series-connected transistor is exposed to a high voltage sufficient to break down the silicon dioxide layer of the transistor. Tamura et al. disclose the addition of another transistor to the circuit to avoid exposing the first transistor to the break down potential.

The observations above generally indicate that there are still disadvantages with each of the prior art memory technologies

DETAILED DESCRIPTION

A semiconductor memory cell having a data storage element constructed around a gate oxide is used to store information by stressing the ultra-thin dielectric into breakdown (soft or hard breakdown) to set a leakage current level of the memory cell. The memory cell is read by sensing the current drawn by the cell. A suitable ultra-thin dielectric is the high quality gate oxide of about 50 Å thickness or less used in a transistor, as is commonly available from presently available advanced CMOS logic processes. Such oxides are commonly formed by deposition, by oxide growth from a silicon active region, or by some combination thereof. Other suitable dielectrics include oxide-nitride-oxide composites, compound oxides, and so forth.

In the following description, numerous specific details are provided to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment"means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The present invention is related to other types of gate oxide breakdown based flash memory designs developed by the present inventor and assigned to the same assignee as the present invention. Examples are shown in U.S. patent application Ser. No. 09/955,641 filed on Sep. 18, 2001 entitled "SEMICONDUCTOR MEMORY CELL AND MEMORY ARRAY USING A BREAKDOWN PHENOMENA IN AN ULTRA-THIN DIELECTRIC", U.S. patent application Ser. No. 10/024,327 filed on Dec. 17, 2001 entitled "SEMICONDUCTOR MEMORY CELL AND MEMORY ARRAY USING A BREAKDOWN PHENOMENA IN AN ULTRA-THIN DIELECTRIC", U.S. patent application Ser. No. 09/982,034 filed on Oct. 17, 2001 entitled "SMART CARD HAVING NON-VOLATILE MEMORY FORMED FROM LOGIC PROCESS", and U.S. patent application Ser. No. 09/982,314 filed on Oct. 17, 2001 entitled "REPROGRAMMABLE NON-VOLATILE OXIDE MEMORY FORMED FROM LOGIC PROCESS", each of which is hereby incorporated by reference. However, in each of the memory cells described above, the cell size is relatively large. The present invention provides a much smaller cell size, thereby allowing a higher density.

Figure 1:
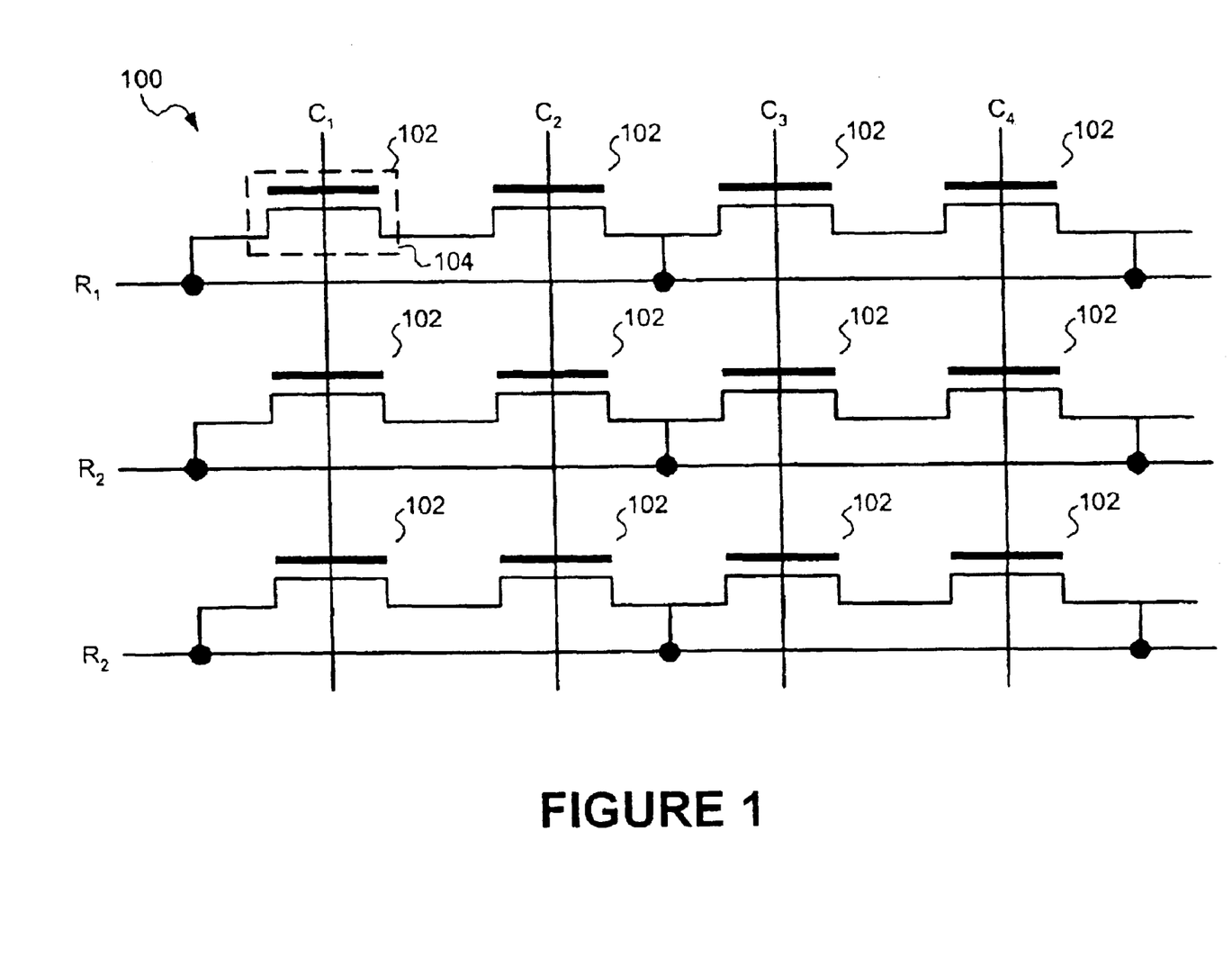
FIG. 1 is a schematic circuit diagram of a portion of a memory array in accordance with the present invention.

FIG. 1 shows an example of a memory array 100 formed in accordance of with the present invention. The memory array 100 is a four column by three row array, however, it can be appreciated that the array can be any arbitrary size. The memory array 100 includes twelve memory cells 102, each of which comprises a MOS transistor 104. The memory cell 102 at, for example, the crosspoint of the first row $R_1$ and the first column $C_1$ includes a MOS transistor 104 having its gate connected to a column line $C_1$ (also referred to herein as a "bitline" or "column bitline"), its source connected to a row line $R_1$ (also referred to as a "wordline" or "row wordline"), and its drain left floating connected to a drain of an adjacent memory cell 102.

As will be seen below, during the programming step, a relatively large voltage is applied to the gate of the transistor 102 (through the bitline $C_x$, where x=1 to M and M is the total number of columns) of the selected column to break down the gate oxide of the transistor 102. The other memory cells 102 shown in FIG. 1 are also formed from, in one embodiment, identical transistors 102 at the crosspoints of the column bitlines $C_x$ and row wordlines $R_y$, where y=1 to N and N is the total number of columns.

The use of transistors 102 as data storage elements in the memory array 100 of FIG. 1 is advantageous because the transistors can be fabricated using many conventional CMOS processes using only a single polysilicon deposition step, without adding any mask steps to them. This is in contrast to "floating gate" type flash memory, which requires at least two polysilicon layers. Further, with modern technological advances, the size of a transistor can be made very small. For example, current 0.18 micron, 0.13 micron, and smaller line width processes would greatly increase the density of the flash memory.

Although only a four by three memory array 100 is shown, in practice such memory arrays contain on the order of about one gigabit or more of memory cells when fabricated using, for example, an advanced 0.13 $\mu$m CMOS logic process. Even larger memories will be realized as CMOS logic processes improve further. The memory array 100 in practice is organized into bytes and pages and redundant rows (not shown), which may be done in any desired manner. Many suitable memory organizations are well known in the art.

Figure 2:
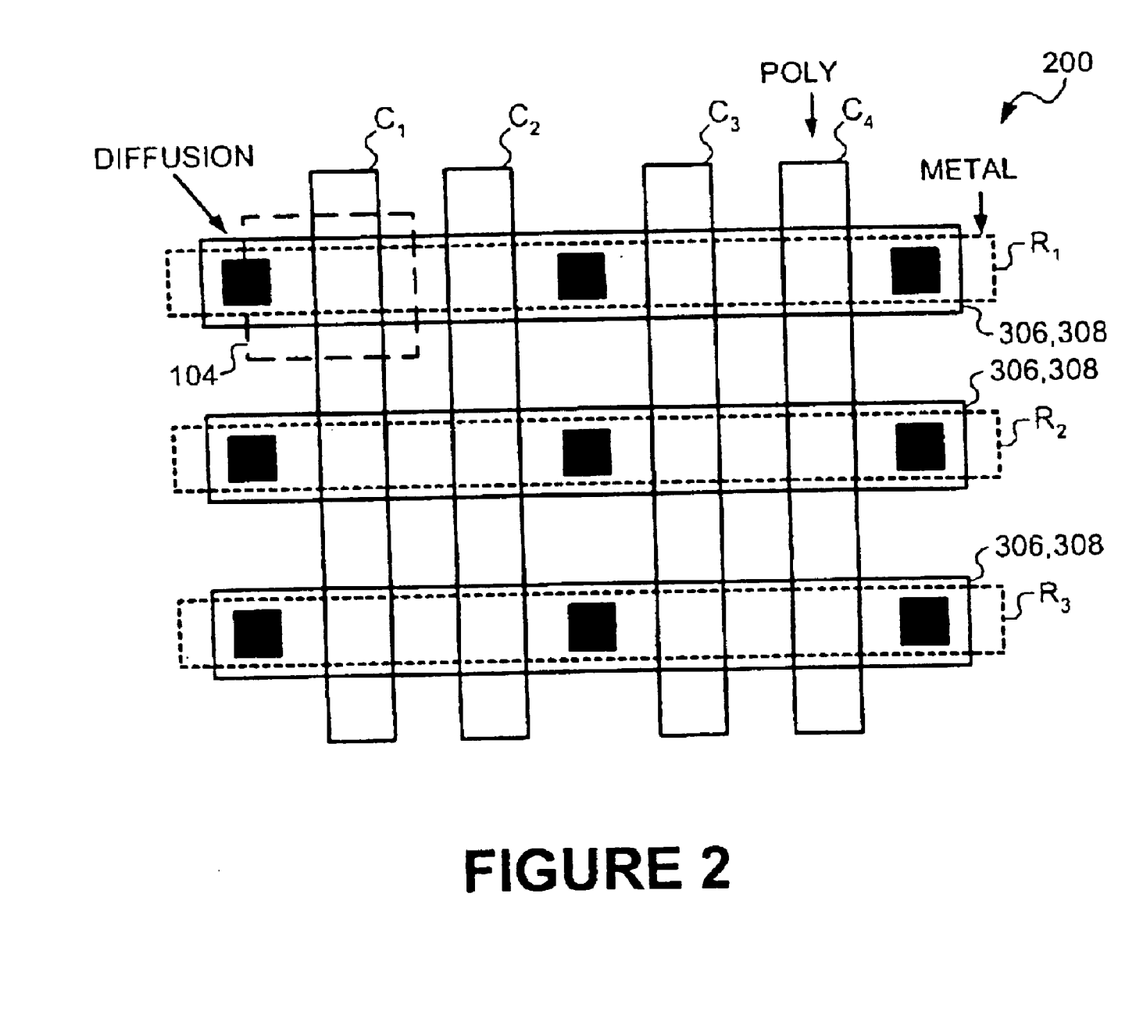
FIG. 2 is a partial layout diagram of a portion of the memory array represented by FIG. 1.
Figure 3:
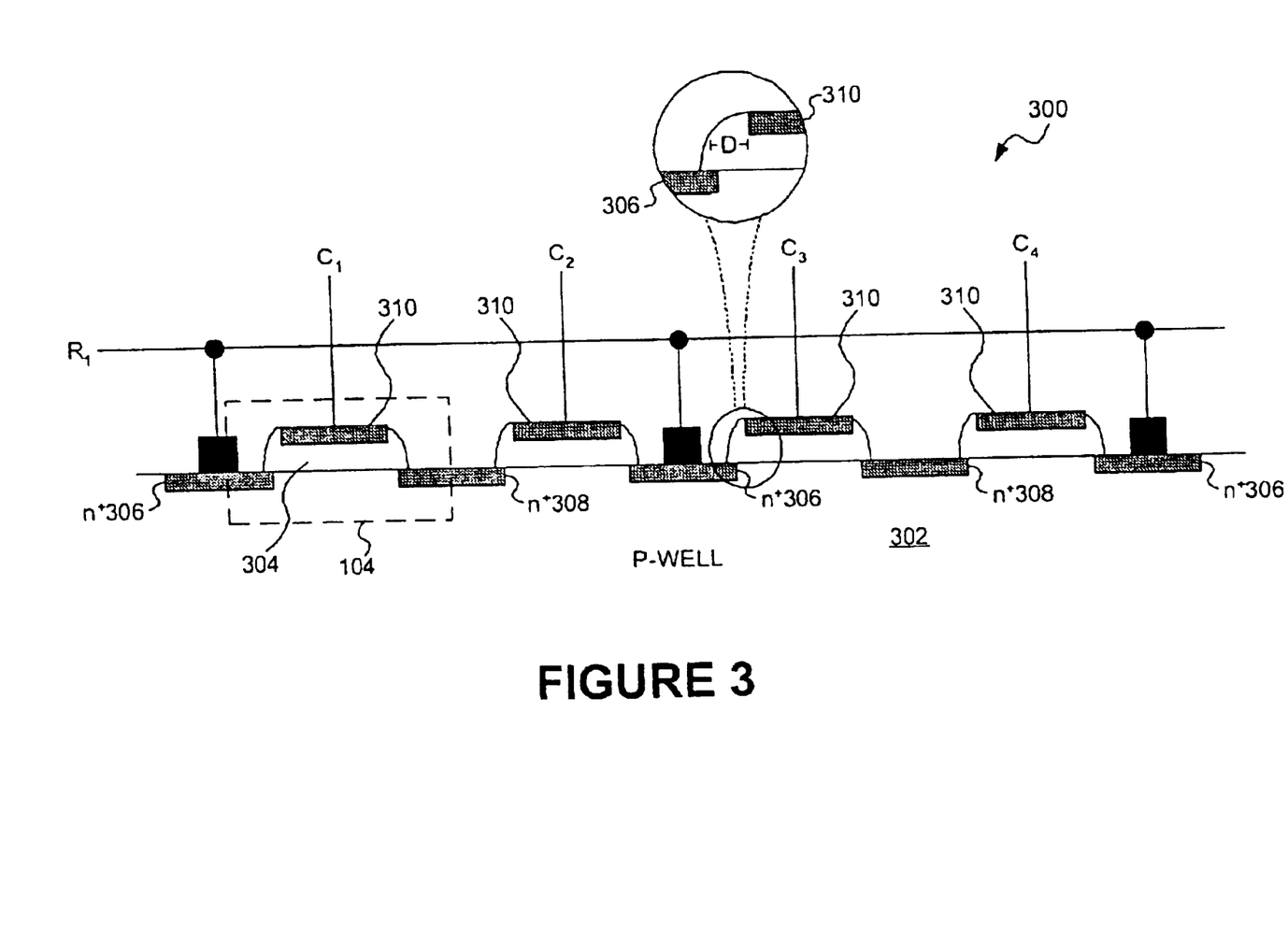
FIG. 3 is a cross-section diagram of an integrated circuit structure for the portion of the memory array corresponding to FIG. 2.

FIG. 2 shows a partial layout diagram 200 for a portion of the memory array 100, and FIG. 3 presents a cross-section of an illustrative MOS integrated circuit 300 showing the principal structural aspects thereof corresponding to the memory cells 102 formed by transistors 104 in accordance with the layout diagram of FIG. 2. The layout diagram of FIG. 2 is suitable for an advanced CMOS logic process. The term MOS is commonly understood to pertain to any gate material, including doped polysilicon and other good conductors, as well as to various different types of gate dielectrics not limited to silicon dioxide, and the term is so used herein. For example, the dielectric may be any type of dielectric, such as an oxide or nitride, which undergoes a hard or soft breakdown upon the application of a voltage for a period of time. In one embodiment, a thermally grown gate silicon oxide of about 50 angstroms (50 A for 0.25 um, 30 A for 0.18 um and 20 A for 0.13 um process) thick is used.

The memory array 100 preferably is laid out in a grid in which the column lines such as $C_1$, $C_2$, $C_3$, and $C_4$ are orthogonal to the row lines such as $R_1$, $R_2$, and $R_3$, as well as the diffused source and drains of the transistors 104. The transistor 104 at the crosspoint of the row line $R_1$ and the column line $C_1$ is formed in a p-well active region 302 in the following manner.

An ultra-thin gate oxide layer 304 is formed by either deposition or thermal oxidation. This is followed by a deposition and doping of a polysilicon layer, which is patterned using a gate mask containing patterns for the column bitlines $C_1$, $C_2$, $C_3$, and $C_4$, which also serve as gates 310 for the transistors 104. Alternatively, the column bitlines may be separate structure that are connected to the gates 310 of the transistors through column bitline segments. The various source and drain regions are formed by conventional process steps (implants, spacers, and n+ source/drain implants), creating the n+ source regions 306 and n+ drain regions 308. Importantly, it should be noted that the polysilicon gate 310 for the transistors 104 should not overlap with the n+ source/drain regions. Thus, a lightly doped drain structure is not employed. As will be seen below, by not having the polysilicon gate 310 overlap or proximal to the n+ source/drain regions, during programming, the polysilicon gate will not short directly to the n+ source/drain regions.

Further, contact vias (also referred to as row wordline segments) to n+ source regions 306 are formed to allow connection with the row lines $R_y$. The row lines $R_y$ are formed from a metal deposition that is subsequently etched. Further, an interlayer dielectric (not shown) is deposited over the polysilicon layer. Thus, the contact vias connecting the metal row lines $R_y$ to the n+ source regions 306 are formed within the interlayer dielectric.

Figure 4:
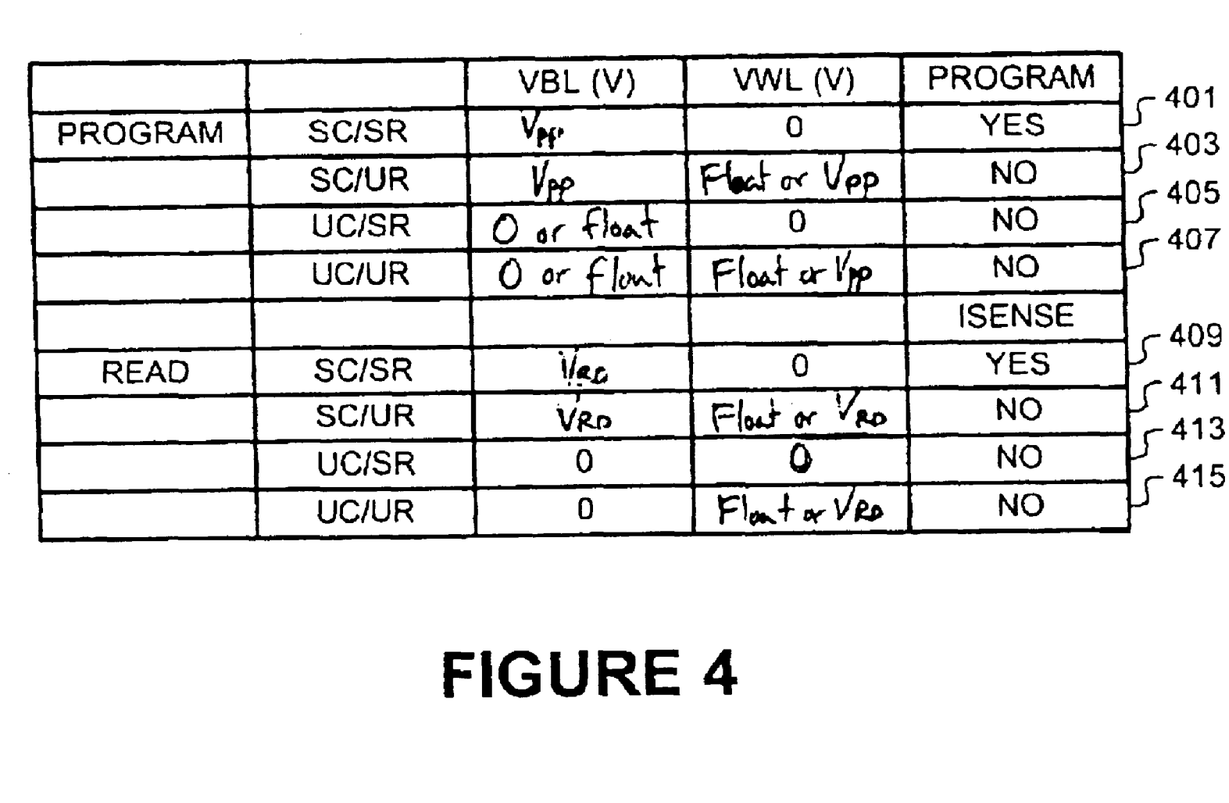
FIG. 4 is a table of voltages showing the operation of the memory cell of FIGS. 1–3.

The operation of the memory array 100 is now explained with reference to the illustrative voltages shown in FIG. 4. It will be appreciated that the voltages are illustrative, and that different voltages are likely to be used in different applications or when different process technologies are used. During programming, the various memory cells in the memory array 100 are exposed to one of four possible programming voltage combinations, which are shown on lines 401, 403, 405, and 407 of FIG. 4. Read voltages are shown on lines 409, 411, 413, and 415. Assume that a memory cell 102 is selected for programming and is located at the crosspoint of $R_1$ and $C_1$. The selected memory cell 102 is referred to as at the selected row and selected column ("SR/SC"). As shown on line 401, the voltage on the selected wordline $R_1$ (designated as $V_{W1}$ or "voltage on the wordline") is 0 volts and the voltage on the bitline $C_1$ (designated as $V_{bl}$ or "voltage on the bitline") is a programming voltage ($V_{PP}$), in this case 8 volts. Thus, the voltage across the gate (the bitline $C_1$) of the transistor 104 and the source (the wordline $R_1$) of the transistor 104 is 8 volts. The gate oxide 304 of the transistor 104 is designed to break down at this potential difference, which programs the memory cell. During programming, the voltage potential breaks down the gate oxide and results in a leakage current through the gate oxide into the underlying substrate and collected mostly by the N+ source/drain, which is connected to ground. Further, the result of this is that a programmed n+ region 501 (see FIG. 5) is formed in the p-well 302 between the n+ source region 306 and the n+ drain region 308 of the transistor 104.

It can be appreciated that the precise magnitude of voltages applied is dependent upon the thickness of the gate oxide and other factors. Thus, for example, for a 0.13 micron CMOS process, the gate oxide is typically thinner, thereby requiring a lower voltage differential between the selected wordline and the selected bitline. In one embodiment, where a 0.13 micron CMOS process is used, the bitline $C_1$, and the unselected word line has a voltage of 4.5 volts and the unselected bitline $R_1$ has a voltage of between 0 and 1.2 volts.

With $R_1$ and $C_1$ being the selected row and column, consider the impact on the memory cell 102 at the crosspoint of a selected row and an unselected column ("SR/UC"), e.g., $R_1$ and $C_2$. As shown on line 405, the voltage on the wordline $R_1$ is 0 volts and the voltage on the unselected bitline $C_2$ is 0 or floating. This causes a relatively low potential difference across the gate oxide 304 of the transistor 104, which is insufficient to break down the gate oxide for the transistor 104 at the crosspoint. The memory cell 102 does not program under these conditions.

With $R_1$ and $C_1$ being the selected row and column, consider the impact on the memory cell 102 at the crosspoint of a selected column and an unselected row ("UR/SC"), e.g.

$R_2$ and $C_1$. As shown on line 403, the voltage on the unselected wordline $R_2$ is floating or $V_{PP}$ and the voltage on the bit line $C_1$ is at $V_{PP}$ (8 volts in this example). This causes a relatively low potential difference across the gate oxide 304 of the transistor 104. The memory cell 102 does not program under these conditions.

With $R_1$ and $C_1$ being the selected row and column, consider the impact on the memory cell 102 at the crosspoint of an unselected column and an unselected row ("UR/UC"), e.g. $R_2$ and $C_2$. As shown on line 407, the voltage on the unselected wordline $R_2$ is floating or $V_{PP}$ and the voltage on the unselected bitline $C_2$ is 0 volts or floating. This causes a negative potential difference across the gate 304 and the N+ source/drain of the transistor 104. Since the N+ source/drain is positive and gate is negative, the higher voltage on the source/drain will not pass under the gate, so the memory cell 102 does not program under these conditions. Further, the voltage on the unselected wordline could be biased to an intermediate voltage, such as 2V to 6V to prevent the cell from being programmed. However, the programmed cell will cause a leakage current from the selected bitline to the unselected wordline. If the unselected bit line is floating, the leakage current will charge it up, which causes the voltage to raise up in the bitline. By biasing the unselected wordlines $R_x$ to $V_{PP}$, we can prevent this leakage and thus the charge time of the selected bitline through programmed cells can be reduced.

Figure 5:
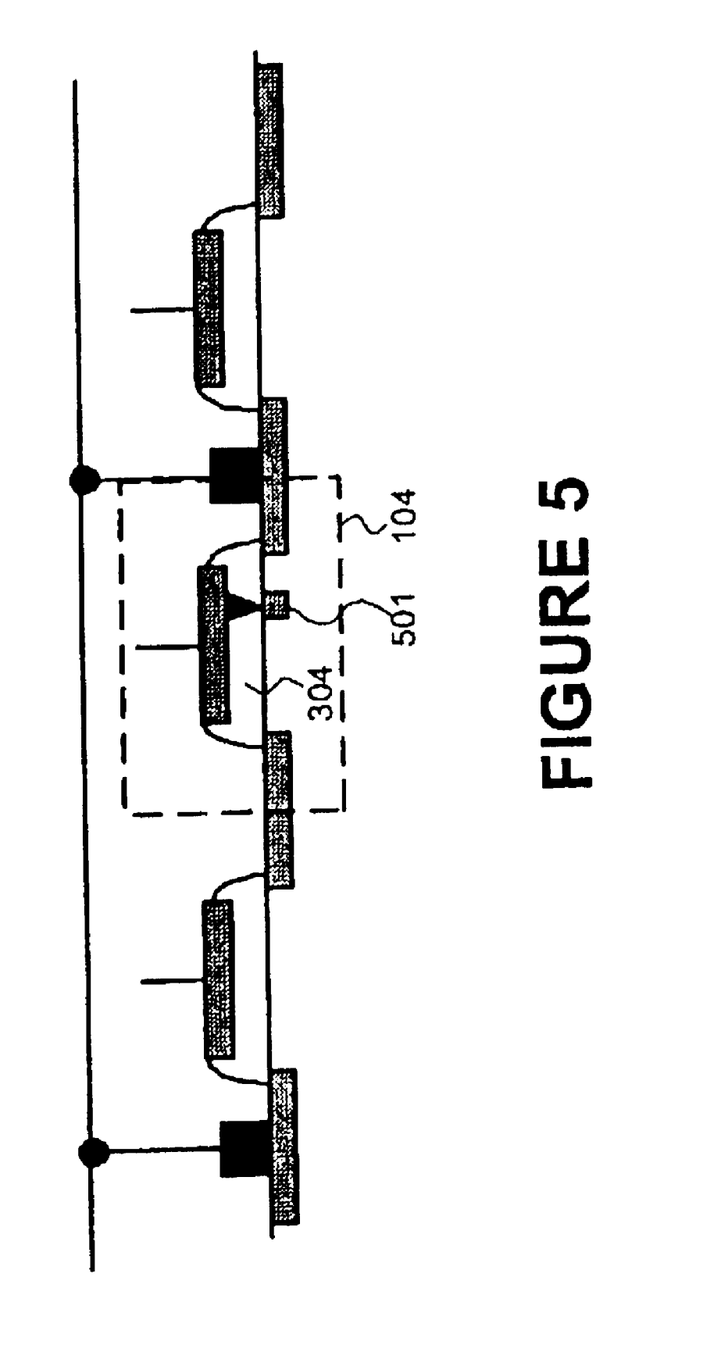
FIG. 5 is a cross-section diagram of a memory cell that has been programmed.

After a memory cell 102 has been programmed by breaking down the gate oxide 304, the physical characteristics of the cell 102 is changed. Turning to FIG. 5, a transistor 104 of the memory cell 102 has been programmed. During programming, a programmed n+ region 501 is formed underneath the gate of the transistor 104. This programmed n+region 501 is formed as current (during the programming process) pierces through the gate oxide 304 and deposits into the substrate (p-well 302).

Although difficult to view clearly in FIG. 3, as noted above, the polysilicon gate 310 for the transistors 104 should not overlap vertically with the n+ source/drain regions 306 and 308. Indeed, the separation laterally between the gate 310 and the n+source region 306 and n+ drain region 308, by for example the use of a CMOS LDD spacer, should be sufficient to prevent short circuiting during programming. As seen in FIG. 3, this lateral separation is designated as a lateral distance D. In one embodiment, the lateral distance D is between 0.02 microns to 0.08 microns as formatted by a LDD dielectric spacer in CMOS logic devices. By not having the polysilicon gate overlap or proximal to the n+ source/drain regions, during programming, the polysilicon gate will not short directly to the n+ source/drain regions. Instead, the programmed n+ region 501 is formed. Further, alternative methods by which short circuiting is avoided between the gate 310 and the n+ regions 306 and 308 may be utilized. As but one example, the gate oxide near the n+ regions 306 and 308 may be made thicker by poly gate sidewall oxidation after the gate poly etch. It can be appreciated that other methods are also suitable.

Figure 6:
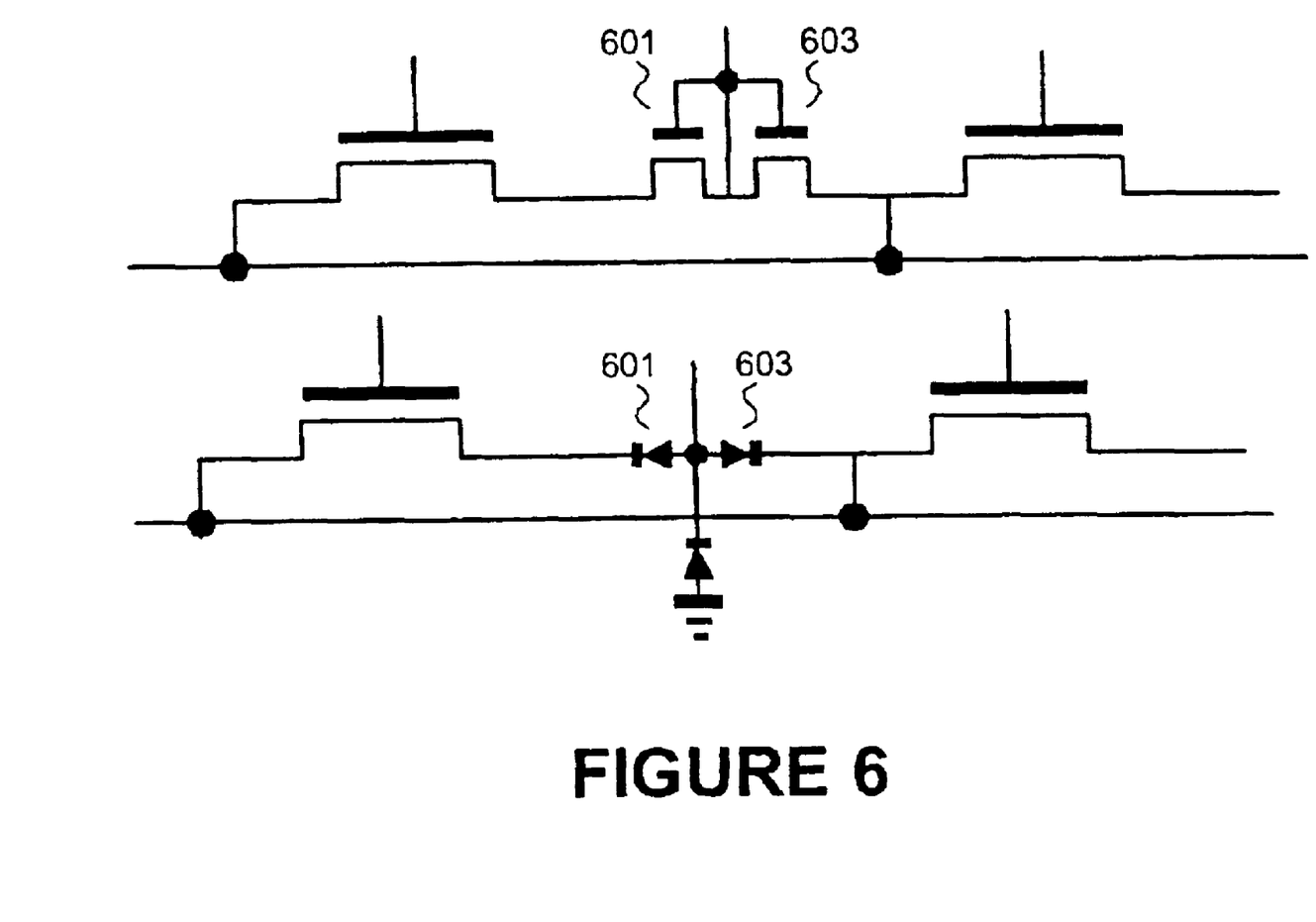
FIG. 6 is a schematic circuit diagram of a memory cell that has been programmed.

The programmed memory cell of FIG. 5 can be seen in schematic form in FIG. 6. The result of programming a memory cell is the formation of two gated diodes 601 and 603. The gated diodes 601 and 603 prevent current from flowing from the wordlines $R_y$ to the bitlines $C_x$. However, current will be allowed to flow from the bitlines $C_x$ to the wordlines $R_y$ during the read operation since the positive gate bias can induce a n+inversion, which can make the connection to the N+ source/drain regions.

The memory array 100 is read in the following manner. A read select voltage $V_{RD}$ (for example 1.8 volts) is placed on the selected column bitline ("SC") and a read select voltage of 0 volts is placed on the selected row wordline ("SR"). Note that these voltages are for a typical 0.18 micron CMOS process. Lower voltages would be typically used for smaller more advanced CMOS processes. For example, for a 0.13 micron CMOS process, the read select voltage on the selected column bitline may be approximately 1.2 volts.

Assume that $R_1$ and $C_1$ are the selected row and column ("SC/SR") and that the memory cell 102 at that crosspoint is programmed. As shown on line 409, 1.8 volts (a read select voltage) is applied via bitline $C_1$ to the gate of the transistor 104 and 0 volts is applied to the source via the wordline $R_1$. This causes a current to flow from the bitline $C_1$, through the gate oxide of the transistor 104, and out through the wordline $R_1$, which is ground to zero. By detecting the current on the bitline, it can be determined whether the memory cell 102 is programmed. If the memory cell 102 is not programmed, no current will flow, which indicates that the memory cell is not programmed.

With $R_1$ and $C_1$ being the selected row and column for the read operation, consider the impact on the memory cell 102 at the crosspoint of a selected column and an unselected row ("UR/SC"), e.g. $R_2$ and $C_1$. As shown on line 411, 1.8 volts is on the selected bitline $C_1$ and the source via the unselected wordline $R_2$ is held to floating or $V_{RD}$. There is no voltage potential across the transistor and no current flow, which indicates that the memory cell is not programmed. By biasing the unselected wordline $R_2$ to $V_{RD}$, the charge time of the selected bitline through programmed cells can be reduced. This is because if the unselected wordline is floating, it will take some time to charge it up to by the selected bit through the programmed cell.

With $R_1$ and $C_1$ being the selected row and column for the read operation, consider the impact on the memory cell 102 at the crosspoint of an unselected column and a selected row ("SR/UC"), e.g. $R_1$ and $C_2$. As shown on line 413, 0 volts is on the unselected bitline $C_2$ and 0 volts is applied to the source via the selected wordline $R_1$. There is no voltage potential across the transistor and no current flow, which indicates that the memory cell is not programmed.

With $R_1$ and $C_1$ being the selected row and column for the read operation, consider the impact on the memory cell 102 at the crosspoint of an unselected column and an unselected row ("UR/UC"), e.g. $R_2$ and $C_2$. As shown on line 415, 0 volts is on the unselected bitline $C_2$ and the source via the unselected wordline $R_2$ is held to floating or $V_{RD}$. Even for the cell that was previously programmed, and the programmed cell acts like a reversed biased diode, so there is no current going from the unselected wordline (1.8V) to the unselected bitline (0V), which indicates that the memory cell is not programmed.

Thus, as seen above, during the read cycle, no current is drawn by memory cells at crosspoints having either an unselected row or an unselected column. Note that the unselected wordlines may be left floating. This embodiment will tend to reduce leakage current through the wordlines, as well as allowing the use of smaller word line drivers, thereby saving integrated circuit space.

Moreover, in an alternative embodiment, in order to increase the n+ source/drain junction breakdown voltage and reduce junction leakage in the case of an unselected wordline charged to $V_{PP}$ either from the selected word line through prior programmed cells or through a word line driver, a high energy, low dose n+ implant can be used. The implant may be a standard n+ electrostatic discharge protection implant from a conventional CMOS process or other existing implant steps, thus staying within standard CMOS logic process. Still, in other embodiments, a special implant step may be added to optimize the implanting.

Various studies of oxide breakdown, which were performed in contexts different than the memory cells 102 shown in the array 100, indicate suitable voltage levels for breaking down ultra-thin gate oxides and establishing that the breakdown is controllable. When an ultra-thin gate oxide is exposed to voltage-induced stress, breakdown in the gate oxide occurs. Although the actual mechanisms leading to the intrinsic breakdown of gate oxide are not well understood, the breakdown process is a progressive process passing through a soft breakdown ("SBD") stage followed by a hard breakdown ("HBD") stage. One cause of breakdown is believed to be oxide defect sites. These may act alone to cause breakdown, or may trap charges and thereby cause high local fields and currents and a positive feedback condition that leads to thermal runaway. Improved fabrication processes resulting in fewer oxide defects are reducing the occurrence of this type of breakdown. Another cause of breakdown is believed to be electron and hole trapping at various sites even in defect-free oxide, which also leads to thermal runaway.

Figure 7:
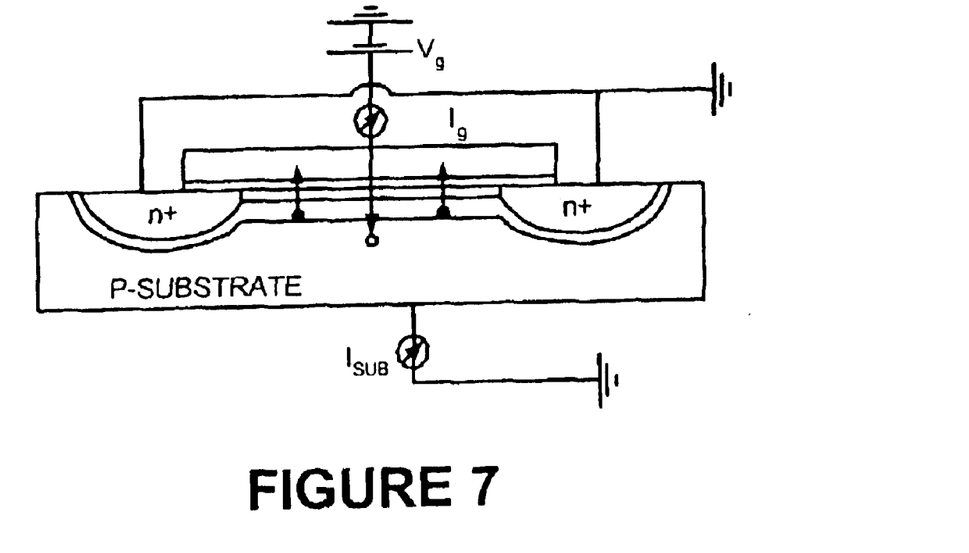
FIG. 7 is a cross-section diagram of an experimental setup.
Figure 8:
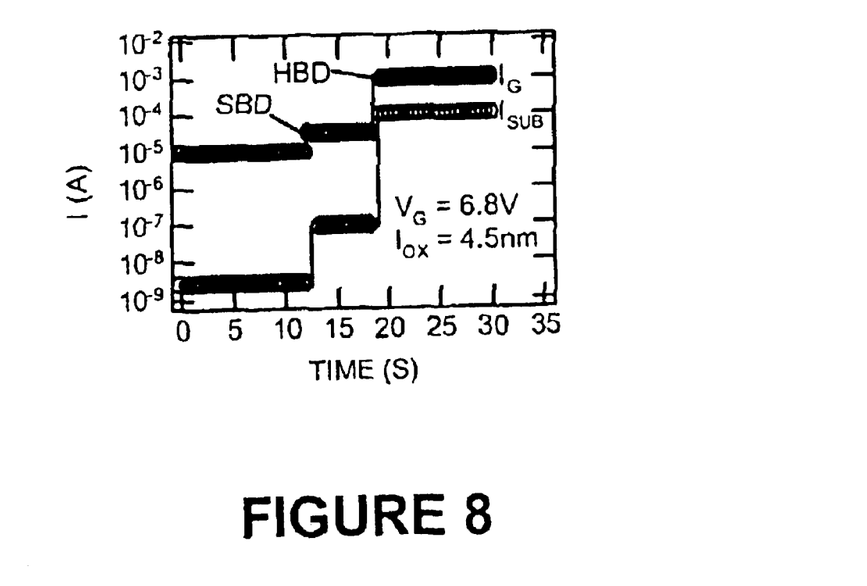
FIG. 8 is a graph showing the effect of a constant voltage stress on an ultra-thin gate oxide.

Rasras et al. performed a carrier separation experiment which demonstrated that, under positive gate bias, impact ionization of the electrons in the substrate is the dominant source of the substrate hole current. Mahmoud Rasras, Ingrid De Wolf, Guido Groeseneken, Robin Degraeve, Herman e. Maes, Substrate Hole Current Origin after Oxide Breakdown, IEDM 00-537, 2000. A constant voltage stress experiment was performed on ultra-thin oxide in an arrangement in which channel inversion was involved, and established that both SBD and HBD may be used for storing data, and that a desired degree of SBD or HBD may be obtained by controlling the time over which the gate oxide storage element is stressed. FIG. 7 shows a schematic cross-sectional representation of the experimental setup. The effect of the constant voltage stress on the ultra-thin gate oxide is shown in the graph of FIG. 8, in which the x-axis is time in seconds and the y-axis is current in amperes expressed logarithmically. FIG. 8 shows the gate and substrate hole current measured before and after soft and hard breakdown under constant voltage stress. For roughly 12.5 seconds, the total current is substantially constant and dominated by an electron current as measured by $I_g$. The leakage is believed to be due to Fowler-Nordheim ("FN") tunneling and stress-induced leakage current ("SILC"). At about 12.5 seconds, a large jump in the measured substrate hole current is observed, which signals the onset of a soft breakdown ("SBD"). The total current remains substantially constant at this new level, albeit with some fluctuation in the substrate current, from about 12.5 seconds to about 19 seconds. At about 19 seconds, large jumps in both the electron current and the substrate hole current signal the onset of hard breakdown ("HBD"). FIG. 8 shows that a desired degree of SBD or HBD may be obtained by controlling the time over which the gate oxide storage element is stressed.

Figure 9:
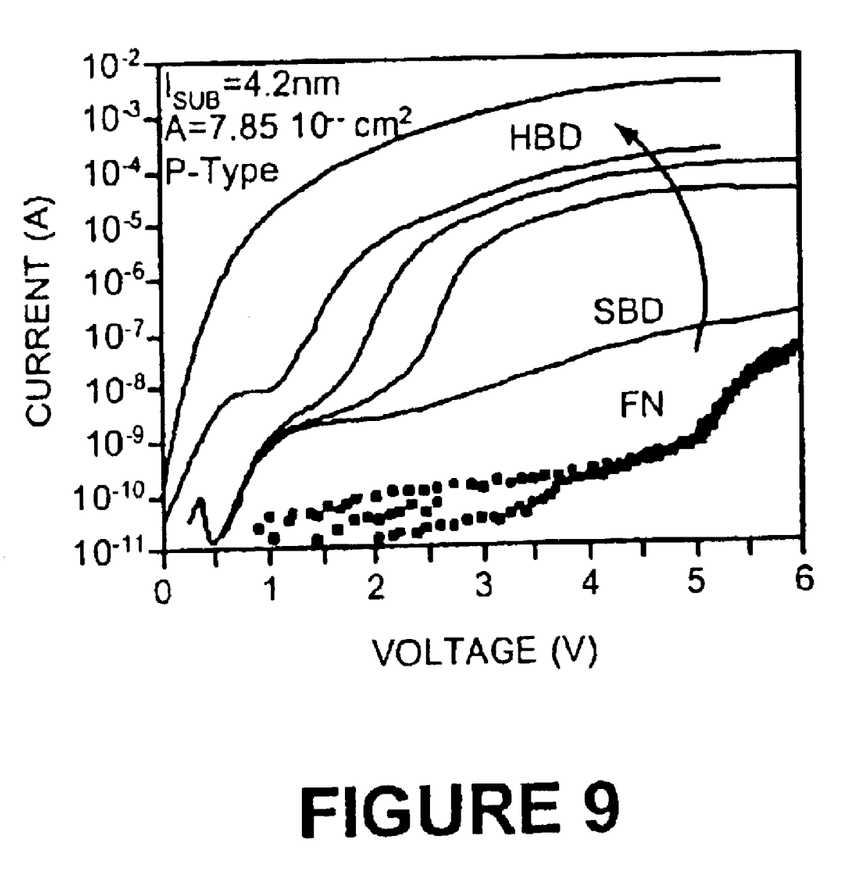
FIG. 9 is a graph showing various stages in the current-voltage characteristics of an ultra-thin gate oxide as degradation proceeds.

Sune et al. studied post SBD conduction in ultra-thin silicon dioxide films. Jordi Sune, Enrique Miranda, Post Soft Breakdown conduction in SiO2 Gate Oxides, IEDM 00-533, 2000. Various stages in the current-voltage ("I-V") characteristics of an ultra-thin gate oxide as degradation proceeds are shown in FIG. 9, in which the x-axis is voltage in volts and the y-axis is current in amperes expressed logarithmically. FIG. 9 shows that a broad range of voltages may be used to program the gate oxide storage element, and that either SBD or HBD may be used to store information in the gate oxide storage element. Several post breakdown I-V characteristics are also included that show the evolution from SBD to HBD. The amount of the leakage current resulting at SBD and HBD as well as at the intermediate situations between these two extremes is roughly linearly dependent on the magnitude of the voltage in a range of about 2.5 volts to 6 volts.

Figure 10:
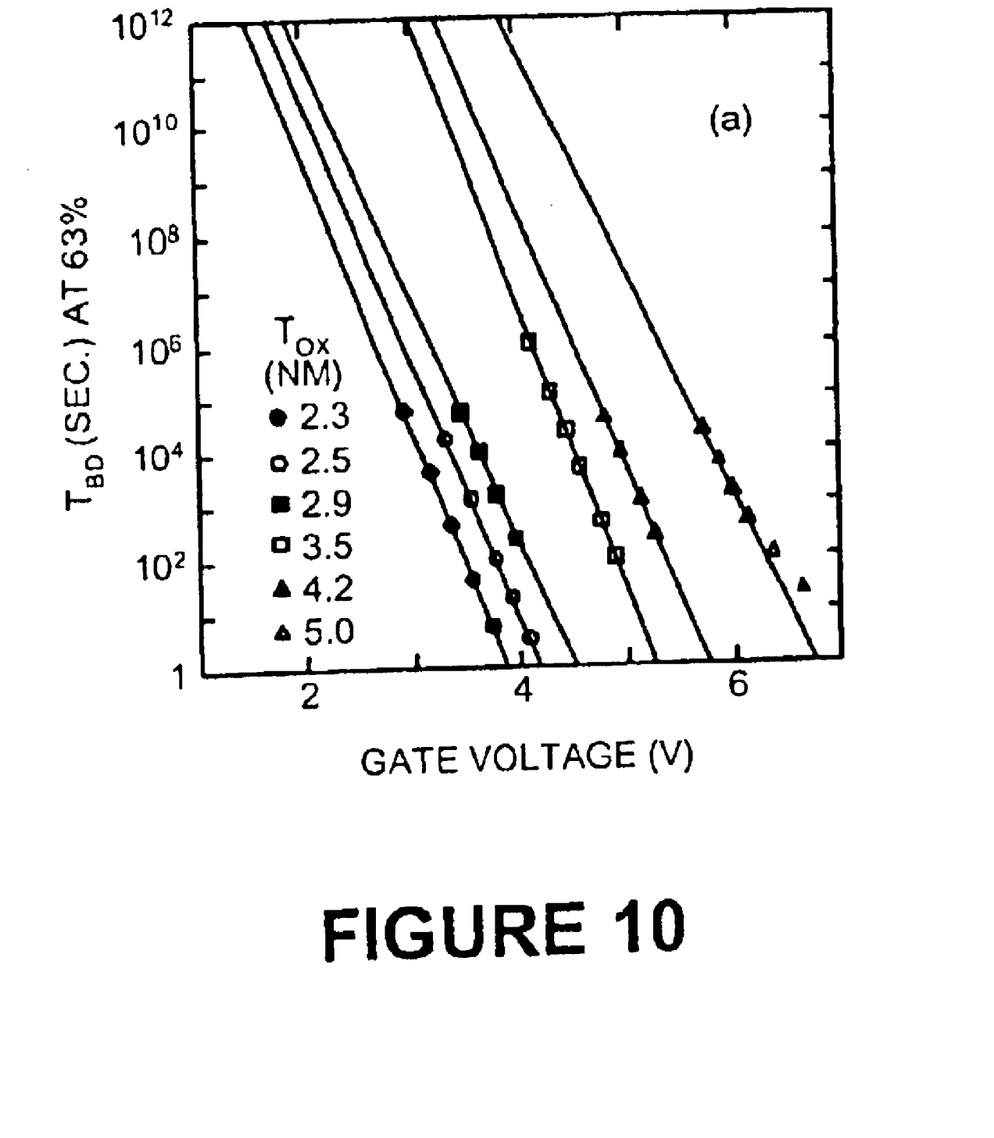
FIG. 10 is a graph showing time-to-breakdown at 63% distribution vs. gate voltage in a semi-log scale measured on n-channel field effect transistors (inversion) for various oxide thickness.

Wu et al. studied the voltage dependency of voltage acceleration for ultra-thin oxides. E. Y. Wu et al., Voltage-Dependent Voltage-Acceleration of Oxide Breakdown for Ultra-Thin Oxides, IEDM 00-541, 2000. FIG. 10 is a graph of time-to-breakdown at 63% distribution vs. gate voltage in a semi-log scale measured n channel FETs (inversion) for oxide thickness varying from 2.3 nm to 5.0 nm. The distributions are in general agreement and are linear, further indicating that the process is controllable.

Figure 11:
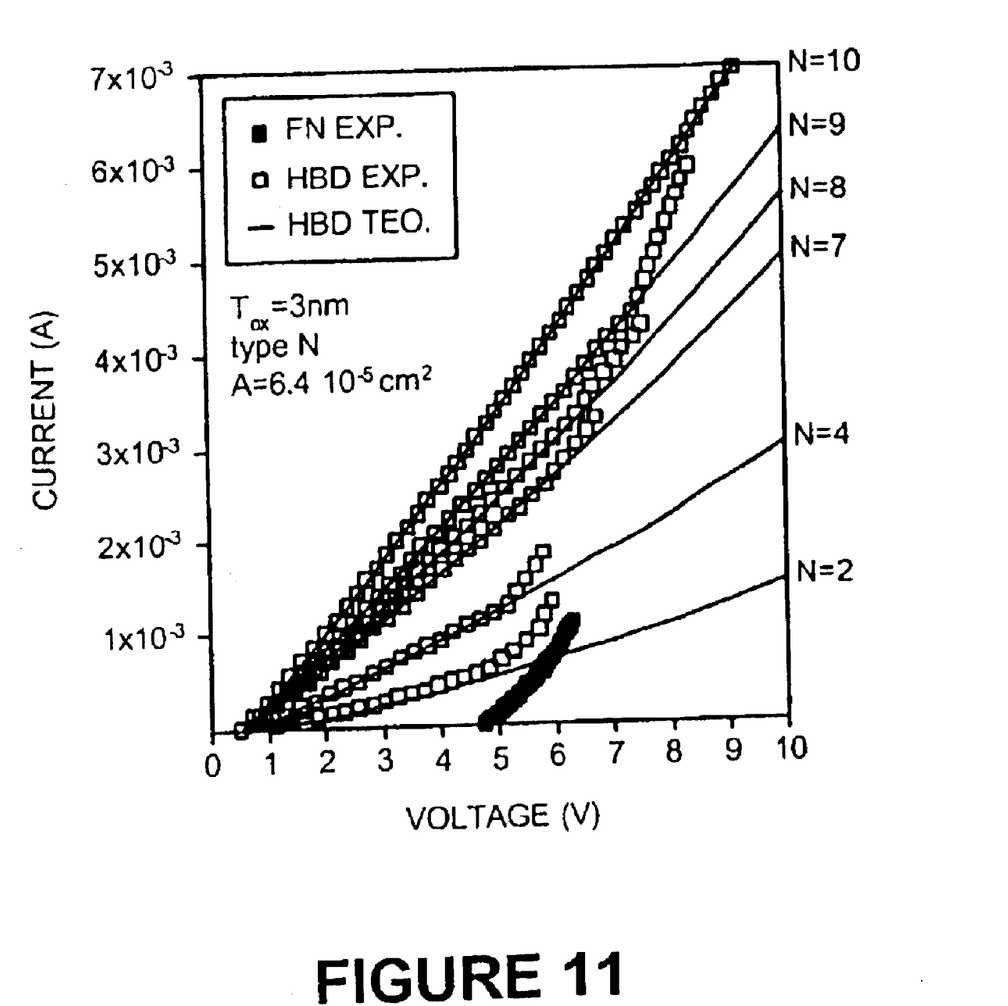
FIG. 11 is a graph showing the current-voltage characteristics of n-type devices measured after the detection of successive breakdown events.

Miranda et al. measured the I-V characteristics of nMOS-FET devices having an oxide thickness of 3 nm and an area of $6.4 \times 10^{-5}$ cm$^2$ after the detection of successive breakdown events. Miranda et al., "Analytic Modeling of Leakage Current Through Multiple Breakdown Paths in SiO$_2$ Films", IEEE 39$^{th}$ Annual International Reliability Physics Symposium, Orlando, Fla., 2001, pp 367–379. FIG. 11 shows the results corresponding to the linear regime in which "N" is the number of conducting channels. The results are quite linear, indicating that the path is essentially resistive.

The transistor used in the memory cells described herein in most cases are normal low voltage logic transistors having, for example, an ultra-thin gate oxide thickness on the order of 50 Å for a 0.25 μm process, or on the order of 20 Å for a 0.13 μm process. The voltage across such an ultra-thin gate oxide can be temporarily during programming much higher than $V_{CC}$, which typically is 2.5 volts for an integrated circuit fabricated with a 0.25 μm process, and 1.2 volts for an integrated circuit fabricated with a 0.13 μm process. Such ultra-thin oxides typically can stand up to as much as 4 or 5 volts without significant degradation on the transistor performance.

The description of the invention and its applications as set forth herein is illustrative and is not intended to limit the scope of the invention. Variations and modifications of the embodiments disclosed herein are possible, and practical alternatives to and equivalents of the various elements of the embodiments are known to those of ordinary skill in the art. For example, the various voltages set forth in the various examples are only illustrative, since one has some discretion as to the precise voltage to select within a range of voltages, and the voltages are in any event dependent on the device characteristics. The terms row wordline and column bitline have been used to describe types of lines commonly used in memories, but some memories may have alternatives thereto. Further, the various doping types may be reversed, such that an n-channel transistor described above may be replaced with a p-channel transistor. These and other variations and modifications of the embodiments disclosed herein may be made without departing from the scope and spirit of the invention.

What is claimed is:

1. A programmable memory cell useful in a memory array having column bitlines and row wordlines, the memory cell comprising:

a transistor having a gate, a gate dielectric between the gate and over a substrate such that there is a stack comprising said gate, gate dielectric, and substrate, without any intervening conductive material, and first and second doped semiconductor regions formed in said substrate adjacent said gate and in a spaced apart relationship to define a channel region therebetween and under said gate, the gate being formed from one of said column bitlines;

a row wordline segment coupled to the second doped semiconductor region of the transistor, said row wordline segment connected to one of said row wordlines; and a programmed doped region formed in said substrate in said channel region when said memory cell has been programmed.

2. The memory cell of claim 1 wherein the gate dielectric of the transistor is thicker proximal to the first and second doped semiconductor regions than at said channel region.

3. The memory cell of claim 1 wherein the gate and said second doped semiconductor region is laterally separated by a distance D.

4. The memory cell of claim 3 wherein said distance D is sufficient to prevent a short circuit with said first or second doped semiconductor regions.

5. The memory cell of claim 1 wherein said first doped semiconductor region is floating.

6. The memory cell of claim 1 further including a lightly doped region formed in said substrate in said channel region.

7. A method of operating a programmable memory array comprising a plurality of row wordlines, a plurality of column bitlines, and a plurality of memory cells at respective crosspoints of the row lines and column lines, said memory cells comprising a transistor having a gate, a gate dielectric between the gate and over a substrate such that there is a stack comprising said gate, gate dielectric, and substrate, without any intervening conductive material, and first and second doped semiconductor regions formed in said substrate adjacent said gate and in a spaced apart relationship to define a channel region therebetween and under said gate, the gate being formed from one of said column bitlines, and a row wordline segment coupled to the second doped semiconductor region of the transistor, said row wordline segment connected to one of said row wordlines, the method comprising:

applying a first voltage to a selected one of the column bitlines and gate of a selected transistor; and applying a second voltage to a selected one of the row wordlines;

wherein the first voltage and the second voltage form a potential difference across the gate dielectric of said selected transistor to cause the formation of a programmed doped region in said substrate in said channel region of said selected transistor.

8. The method of claim 7 wherein during a read operation further including leaving the row wordlines not corresponding to said selected transistor floating.

9. The method of claim 7 wherein said selected transistor is read by applying a third voltage on the gate of said selected transistor and monitoring for a current flowing from said gate to said selected column bitline.

10. The method of claim 8 further including leaving the row wordlines not corresponding to said selected transistor floating.

11. The method of claim 7 further wherein said memory cell has a lightly implant in said channel region.

* * * * *